United States Patent [19]

Sugiura

[11] Patent Number: 4,574,425
[45] Date of Patent: Mar. 11, 1986

[54] FLEXIBLE HINGE ASSEMBLY HAVING A SUBSTRATE SUPPORTING PORTION

[75] Inventor: Haruyuki Sugiura, Kariya, Japan

[73] Assignee: Kitagawa Industries Co., Ltd., Nagoya, Japan

[21] Appl. No.: 734,829

[22] Filed: May 17, 1985

Related U.S. Application Data

[63] Continuation of Ser. No. 542,701, Oct. 17, 1983, abandoned.

[30] Foreign Application Priority Data

Oct. 19, 1982 [JP] Japan .................................. 57-158339

[51] Int. Cl.⁴ .......................... E05D 1/02; E05D 5/00
[52] U.S. Cl. ......................................... 16/225; 16/383
[58] Field of Search ................ 16/225, 383, DIG. 13; 220/339

[56] References Cited

U.S. PATENT DOCUMENTS

| | | | |
|---|---|---|---|
| 2,745,133 | 5/1956 | McWethy | 16/225 |
| 3,516,114 | 6/1970 | Joyce, III | 16/225 |
| 3,574,306 | 4/1971 | Alden | 220/339 X |
| 3,592,354 | 7/1971 | Nielsen | 16/225 X |
| 4,060,173 | 11/1977 | Dahl | 220/339 X |

FOREIGN PATENT DOCUMENTS

| | | | |
|---|---|---|---|
| 1517445 | 2/1968 | France | 16/225 |
| 1064191 | 4/1967 | United Kingdom . | |
| 1109845 | 2/1968 | United Kingdom . | |
| 1131362 | 10/1968 | United Kingdom . | |
| 1168723 | 10/1969 | United Kingdom . | |
| 1262835 | 2/1972 | United Kingdom . | |
| 2005818 | 4/1979 | United Kingdom . | |
| 1548945 | 7/1979 | United Kingdom . | |

Primary Examiner—Fred Silverberg
Attorney, Agent, or Firm—Oblon, Fisher, Spivak, McClelland & Maier

[57] ABSTRACT

A hinge for swingably coupling at least different plate members, which comprises a first mounting portion having first detent protrusions for engaging with each corresponding hole formed on one of said plate member, a second mounting portion having at least a second detent protrusion for engaging with other hole formed on the other plate member, a thin flexible portion between the first and second mounting portion and integrally formed with the two mounting portions so as to bend the second mounting portion, at least two groups of ribs provided at said first and second mounting portions respectively, and engagement projections formed on the first mounting portion and capable of being engaged with the edge of one of said plate members. With this construction, the detent or engagement strength as well as the strength of the hinge unit itself can be increased, while easy access to the plate member such as a printed circuit board within an electric apparatus can be realized.

8 Claims, 8 Drawing Figures

FLEXIBLE HINGE ASSEMBLY HAVING A SUBSTRATE SUPPORTING PORTION

This application is a continuation, of application Ser. No. 542,701, filed Oct. 17, 1983, now abandoned.

BACKGROUND OF THE INVENTION (1) Field of the Invention

The present invention relates to a hinge capable of opening and closing or swingably coupling two plate members attached thereto, more particularly to a hinge which is integrally formed by one piece and which facilitates the mounting of the plate members.

(2) Description of the Prior Art

In different electric apparatuses and appliances, there occurs such a situation where plate members such as a print circuit board or boards, and a chassis of the electric apparatus or appliance are desired to open and close within those apparatuses for the necessity of checking the inner conditions thereof, repairing them, or assembling parts and elements in manufacturing.

In an electric apparatus, for instance, a printed circuit board is normally mounted to a chassis. However, when the checking of the printed circuit boards which have been already mounted or the necessities of changing the inner part or parts of the apparatus is required, it was very difficult, although not impossible, for the printed circuit board or boards to be taken out of the apparatus since the lead wires thereof were fixed within the apparatus. For this purpose, a hinge has been proposed heretofore which couples the printed circuit board and the chassis so as to open and close therebetween and which is capable of easily mounting at least two boards or two plate members.

However, in this kind of hinge according to the prior art, a thin flexible portion is formed at a generally middle portion of a plate member so as to bend the portion while detent protrusions are provided at each part on both sides of the flexible portion and the engagement of each detent protrusions can be realized by engaging it with each engaging hole of the plate member in question. Accordingly, the strength of the detention or engagement is not sufficient since the engagement is done only by the detent protrusions. Furthermore, the strength of the hinge itself is not enough as the hinge according to the prior art is comprised of a single plate member, thus resulting in a problem that the hinge is subject to damage due to shocks produced, in use.

SUMMARY OF THE INVENTION

It is therefore a main object of the present invention to provide a hinge in which the strength of the hinge itself can be increased and the detention or engagement strength thereof is also sufficient while it is easy to mount plate members thereto.

It is another object of the present invention to provide a hinge in which the engagement strength for the plate members to be secured can be made large or compared with the hinge according to the prior art and firm securing can be guaranteed.

It is further object of the present invention to provide a hinge in which mounting of different plate members to the hinge can be easily done without using any screws.

It is still another object of the present invention to provide a hinge in which the provision of projections formed on ribs facilitates to define the gaps between the outer side of the ribs and the inner side of the ribs to a predetermined distance.

It is still further object of the present invention to provide a hinge comprising a first mounting portion having first detent portions, a second mounting portion having at least a second detent portion, a thin flexible portion formed between said first and said second mounting portions, and an engagement projection formed on the first mounting portion, which is all integrally made of synthetic resin.

One of the features according to the present invention resides in a hinge unit for swingably coupling at least two different plate members in which it comprises a first mounting portion having first detent portions capable of engaging with first engagement portions formed on one of said plate members, a second mounting portion having a second detent portion capable of engaging with a second engagement portion formed on the other plate member, a thin flexible portion integrally formed with said first and second mounting portions so as to bendably couple said first and second mounting portions, at least two groups of ribs provided at said first and second mounting portions respectively, and engagement projections formed on the first mounting portion and capable of being engaged with edges of one of said plate members.

These and other objects and features and advantages of the present invention will be apparent from the following description of the embodiments thereof with reference to the accompanying drawings.

DETAILED DESCRIPTION OF THE PREFERRED EMBODIMENT

Figure 1:
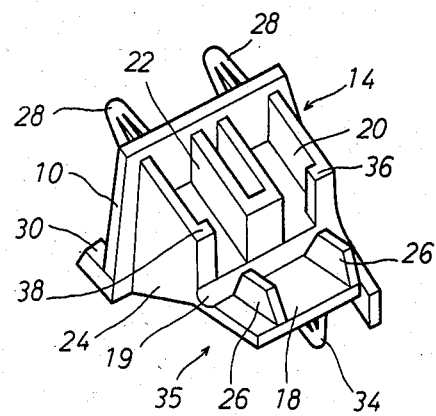
FIG. 1 is a perspective view of one embodiment of the hinge according to the present invention.
Figure 2:
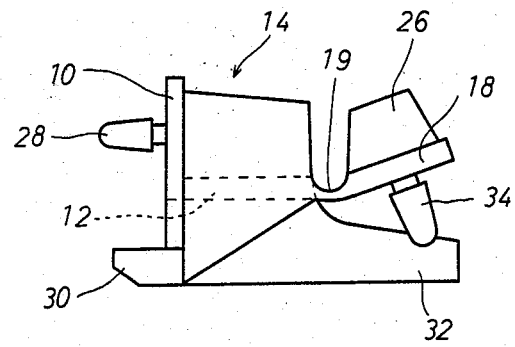
FIG. 2 is a side elevational view of the embodiment of the hinge according to the present invention.

Referring to FIGS. 1 and 2, the hinge according to the present invention comprises a first mounting portion consisting of a first plate 10 and a second plate 12 provided at the right angle to the first plate 10. At one end portion of the second plate 12 there is provided a third plate 18. A thin flexible portion 19 is formed between the second plate 12 and the third plate 18 so as to be flexible, which is integrally made of the two plates 12 and 18. At the first plate 10 and the second plate 12, there are provided a plurality of ribs 20, 22, 24, 26 so as to reinforce the plates.

The plate 10 forms a portion to be mounted in the vicinity of the edge of a plate member such as a chassis having a flat plane. On the other surface one on which the second plate 12 is provided, there are provided a pair of detent protrusions (28, 28) formed perpendicular to the first plate 10.

The detent protrusions 28 forming an arrowhead shape as a whole are integrally formed respectively with a center pillar portion and a pair of tapered resilient pieces which are formed on both sides of the center pillar portion. The detent protrusions 28 can be easily mounted to the chassis when the head of the each resilient detent protrusion is inserted into each engaging hole H (see FIG. 5) on one of the plate members such as the chassis and is penetrated through the hole.

After the head of the detent protrusion is penetrated and the pair of the tapered resilient pieces restores its shape due to its expansion, respectively, the chassis can be secured or fixed by the detent protrusions.

As described in the foregoing, the first mounting portion consisting of the first plate 10 having at least two detent protrusions and the second plate 12 is thus constructed.

Figure 3:
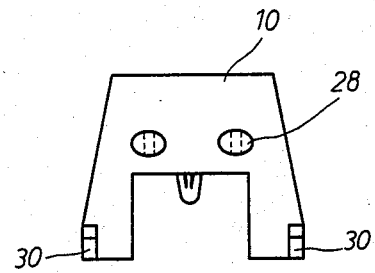
FIG. 3 is a left side view of the hinge according to the present invention.

FIG. 3 which shows a left side view of the hinge according to the present invention in which each leg portion is extended from the lower portion of the first plate 10 and a pair of engagement projections 30 are formed at the lower end of the leg portions. The engagement projections 30 are engaged with each edge portion of the bent portion of the chassis to which the plate 10 is mounted, by hooking it to the edge portion respectively, so that possible movement or rotation of the plate 10 in the direction of the surface thereof can be restricted. Accordingly, the detention or engagement strength of the hinge according to the present invention becomes large while the shock resisting characteristic of the first plate against the upward force in the direction of the surface thereof from the bottom can be also improved.

Figure 4:
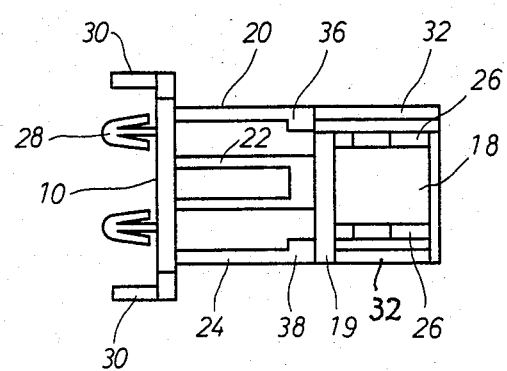
FIG. 4 is a top view view of the hinge according to the present invention.

In the hinge according to the present invention, ribs 20, 22, 24 are arranged between the first plate 10 and the second plate 12. Namely, as shown in FIGS. 1 and 4, the rib 24 is provided at one side end of the second plate 12 and it extends upward and downward. The rib 20 which is mounted at the other end of the plate 12 extends to both upward and downward similarly as in the case of the rib 24. The extended portion 32 is formed at the right end thereof as shown in FIG. 2.

Moreover, the rib 22 having the particular shape as shown in FIGS. 1 and 4 with each one end portion of the two plate portions connected together, is arranged between the ribs 20 and 24.

Returning to FIG. 2, on the lower surface of the plate 18, there is provided same or similar detent protrusion 34 for engaging with a plate member such as printed circuit board, as those indicated by the reference numeral 28. In this manner as described, the second mounting portion 35 consisting of the third plate 18 and the detent protrusion 34 is thus constructed.

On the surface of the third plate 18, there are provided a pair of ribs 26, 26 which are arranged so as not to rest on or contact with the ribs 20, 22 and 24 when the plate 18 is bent at the flexible portion 19. Each projection 36 and 38 is formed at the inner side of each one end portion of the ribs 20 and 24 in such a manner that when the second mounting portion 35 is bent, the gap between the side surface of each rib 26 and the projections 36, 38 is maintained constant.

Furthermore, each gap or space between the inner side surface of the pair of the ribs 26 and the rib 22 are maintained small. As a result, when the plate 18 which is secured on one plate member such as a printed circuit board, is subject to force in the lateral direction, i.e. in the perpendicular direction to the face of the paper in FIG. 2, each side surface of the pair of ribs 26 contacts or rests on the projections 36 and 38, that is, the ribs 26 enter the projections 36, 38 and the rib 22, with the result that the flexure in the lateral direction is restricted and the strength of the hinge becomes large.

Moreover, the provision of the projections 36 and 38 formed on the ribs 20 and 24 partially facilitates to define the gaps between the outer side of the rib 26 and the inner side of the ribs 20 and 24 to a predetermined distance and it also realizes easy manufacturing of the hinge.

In addition, when the third plate 18 is bent at a generally right angle to the second plate 12, the upper surface of the third plate 18 rest on the end of the ribs 20, 22 and 24 and further bending movement can be restricted.

The hinge according to the present invention which is integrally formed, can be made of synthetic resin such as nylone, polypropylene.

Figure 5:
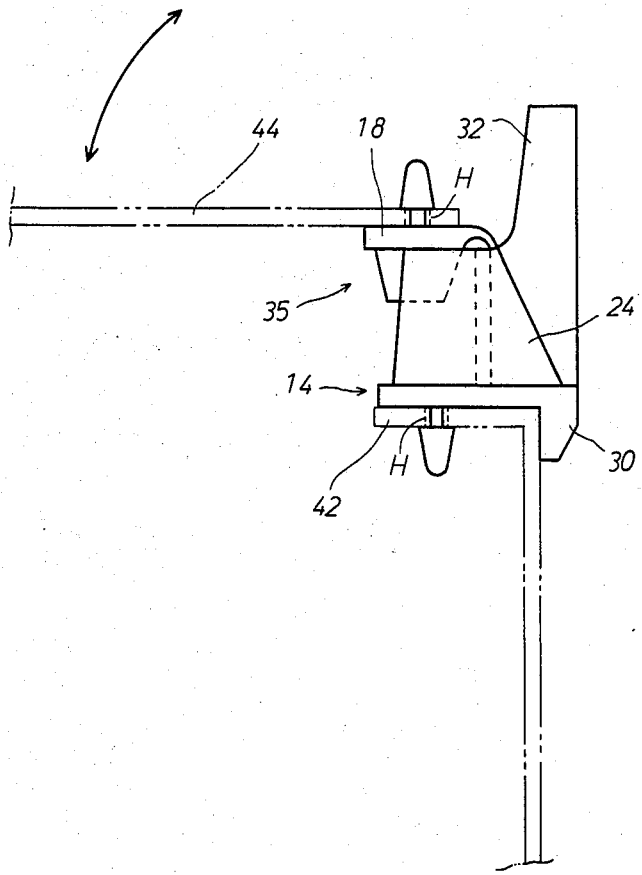
FIG. 5 is a side elevational view of the hinge unit according to present invention in use in the closed or bent condition of the second mounting portion, with two different plate members mounted thereto.

FIG. 5 shows one application of the hinge unit thus constructed, according to the present invention. In the same figure, the first mounting portion 14 secures a bent plate member 42, such as a chassis while the second mounting portion 35 secures another plate member 44 such as a printed circuit board. In this case, when the plate member 44 is closed, i.e. bent, the third plate 18 rests on each edge surface of the ribs 20, 22, 24 as shown in FIG. 1 and further pivotal or bending movement can be blocked. Accordingly, the plate member 44 or the printed circuit board can be readily held in a predetermined closed condition.

Figure 6:
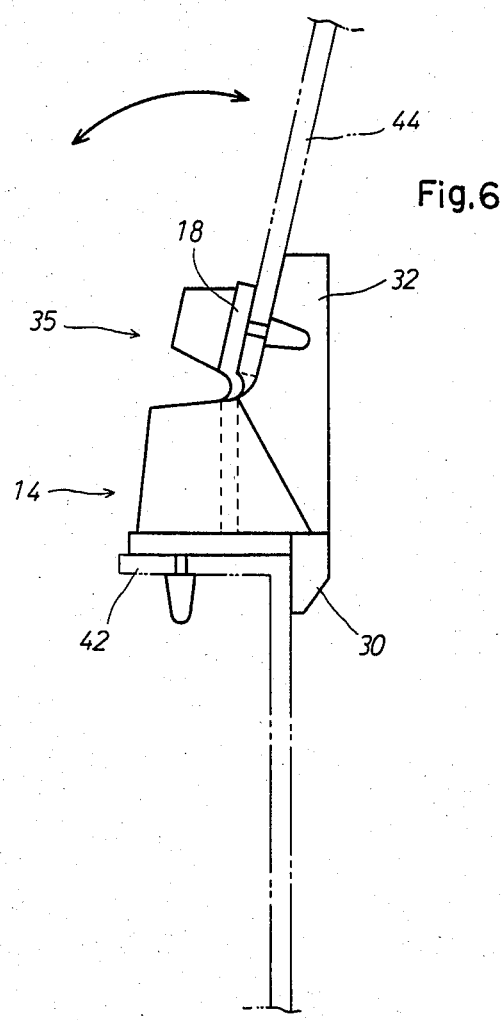
FIG. 6 is a side elevational view of the hinge according to the present invention in use in the opened condition of the second mounting portion, with the two different plate members mounted thereto.

On the other hand, when the plate member 44 is opened, the back surface of the plate member 44 rests on the extended portion 32 of the hinge as shown in FIG. 6 and a further swing of the plate member 44 or the printed circuit board can be prevented, thus facilitating checks and repairing work of the electric apparatus.

It is to be appreciated from the description of the foregoing embodiment that at least two mounting portions of the hinge unit according to the present invention are used when securing the different plate members suchm as chassis, or printed circuit board or boards.

In the foregoing embodiment, although the description has been made in the case that the extended portion 32 is formed only at the rib 20. However, it is apparent that the similar extended portion can be also provided at the rib 24 together with the extended portion 32 already provided. Then, the fixing of the plate member 44 or the printed circuit board in the opened condition at certain angle can be improved when the plate member 44 is opened and the retaining force of the plate member or the printed circuit board can be also increased. Moreover, the well balanced appearance of the hinge unit is also obtained by the provision of the another extended portion.

Figure 7:
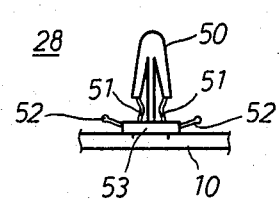
FIGS. 7 and 8 show respectively another version of the detent protrusion according to the present invention.

FIG. 7 shows a detailed construction of another embodiment of the detent protrusion 28. The detent protrusion consists of an arrow head portion 50, linkage members 51, resilient bars 52, and a support member 53. The support member 53 is firmly bonded or attached to the first plate member 10.

Another plate member to be secured is sandwiched and secured between the bottom ends of the arrow head portion 50 and the resilient bars 52 after inserting the arrow head portions 50 into a hole on the another plate member to be secured and penetrating it through the hole H.

Figure 8:
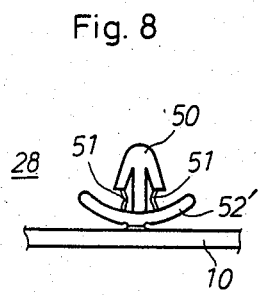

FIG. 8 shows a still modified embodiment of the detent protrusion having the similar arrow head portion 50 in which a resilient arc member 52' in its cross section is used instead of the resilient bars 52 and support member 53 in FIG. 7. The plate member to be secured is similarly sandwiched between the bottom ends of the arrow head portion 50 and the resilient arc member 52'.

As described in the foregoing embodiments according to the present invention, the strength of the hinge per se can be made large since the ribs are provided at the first and second mounting portions which construct the hinge unit.

Moreover, since the engagement projections capable of engaging with edge portion to be secured are provided on either the first mounting portion or the second mounting portion, the engagement strength for the plate members to be secured can be made large and firm securing can be guaranteed. Accordingly, the hinge according to the present invention can be prevented from breaking and coming off due to shocks in use.

In addition, the hinge according to the present invention can be easily mounted without using small screws since it can be easily secured or fixed by the detent protrusions provided at the first and second mounting portions.

While the invention has been described in its preferred embodiments, it is to be understood that the words which have been used are words of description rather than limitation and that various changes and modifications may be made within the purview of the appended claims without departing from the true scope and spirit of the invention in its broader aspects.

What is claimed is:

1. In an assembly of a hinge, a first substrate and a second substrate, the hinge for joining the first substrate and the second substrate at edges thereof in such a manner that said hinge is capable of opening and closing a space between said substrates, said substrates each having at least one hole at the vicinity of said edges, said hinges being used in pairs and comprising:
   (a) a first mounting portion including,
      a first plate,
      first protrusions projection from one surface of said first plate, said first protrusions having an arrowhead shape and being expandable after having been inserted in a hole of said first substrate,
      a second plate extending angularly to said first plate,
      a pair of first ribs extending angularly to both said first plate and said second plate, each of said first ribs being connected to said first plate and said second plate, said first ribs projecting from another surface of said first plate opposite said one surface,
      at least one second rib projecting from said first plate between said first ribs, and
      an extended portion extending from said another surface and being coplanar with at least one of said first ribs, said extended portion being connected to said second plate;
   (b) a second mounting portion including,
      a third plate,
      at least two third ribs projecting from said third plate,
      a second protrusion projecting from a surface of said third plate opposite a surface from which said third ribs project, said second protrusion having an arrowhead shape and being expandable after having been inserted in a hole of said second substrate;
   (c) a first flexible portion bendably connecting said first mounting portion and said second mounting portion,
      wherein said hinge is arranged such that said second rib comes in contact with said third plate and said third ribs reside in spaces between each of said first ribs and said second rib when said third plate is positioned parallel to said first plate, and said second substrate directly abuts and is supported by said extended portion when said third plate is swung into a position approximately angularly to said first plate to prevent further swing of said second substrate.

2. The hinge of claim 1 including a pair of engagement projections provided at edges of said first plate, wherein said first substrate is secured to said first plate by engagement of said first protrusions with an engaging plate projecting angularly from said first substrate, and engagement of said first substrate by said pair of engagement projections.

3. The hinge of claim 1 including projections provided on edges of said first ribs and extending in parallel with said first plate, said projections being formed so as to come into contact with said third ribs when said hinge is in a closed position.

4. The hinge for two substrates as claimed in claim 3, wherein said second rib is composed of a U-shaped plate extending from said first plate and having legs extending in parallel to said first ribs.

5. The hinge of claim 4, including two of said extended portions projecting on two edges of said first mounting portion.

6. The hinge of claim 1, wherein said first and second protrusions include:
   a head portion having said arrowhead shape,
   a resilient arc member supporting said head portion on one of said first and third plates, and
   second flexible portions connecting said head portion and said resilient arc member.

7. The hinge of claim 1, wherein said first and second protrusions include:
   a head portion having said arrowhead shape,
   a support member supporting said head portion,
   second flexible portions connecting said head portion to said support member, and
   resilient arc members projecting on opposing edges of said support member.

8. The hinge of claim 1, being one piece and made of synthetic resin.

* * * * *